(12) United States Patent  (10) Patent No.: US 8,654,538 B2
Kariya et al.  (45) Date of Patent: Feb. 18, 2014

(54) WIRING BOARD AND METHOD FOR MANUFACTURING THE SAME

(75) Inventors: Takashi Kariya, Ogaki (JP); Toshiki Furutani, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 273 days.

(21) Appl. No.: 13/050,217

(22) Filed: Mar. 17, 2011

(65) Prior Publication Data

US 2011/0240357 A1 Oct. 6, 2011

Related U.S. Application Data

(60) Provisional application No. 61/319,024, filed on Mar. 30, 2010.

(51) Int. Cl.
*H05K 1/18* (2006.01)
(52) U.S. Cl.
USPC .......... 361/761; 174/266; 174/260; 174/262; 361/762; 361/763; 361/764
(58) Field of Classification Search
USPC .......... 174/266, 260, 262; 361/762, 761, 763, 361/764
See application file for complete search history.

(56) References Cited

U.S. PATENT DOCUMENTS 5,831,810 A * 11/1998 Bird et al. .................. 361/301.1
6,153,829 A * 11/2000 Carapella et al. ............ 174/541
6,407,345 B1   6/2002 Hirose et al.
6,952,049 B1 * 10/2005 Ogawa et al. ................ 257/700
7,332,816 B2   2/2008 Hirose et al.
2003/0197269 A1 * 10/2003 Su et al. ....................... 257/738
2007/0030628 A1 *  2/2007 Yamamoto et al. .......... 361/311

FOREIGN PATENT DOCUMENTS

JP   2000-353765   12/2000
JP   2003-298234   10/2003
JP      3659167    6/2005
JP   2009-105344    5/2009
JP   2009-105345    5/2009

* cited by examiner

*Primary Examiner* — Tuan T Dinh
*Assistant Examiner* — Steven Sawyer
(74) *Attorney, Agent, or Firm* — Oblon, Spivak, McClelland, Maier & Neustadt, L.L.P.

(57) ABSTRACT

A wiring board including a first substrate having a penetrating hole penetrating through the first substrate, a built-up layer formed on one surface of the first substrate and including multiple interlayer resin insulation layers and wiring layers, the built-up layer having an opening portion communicated with the penetrating hole of the first substrate and opened to the outermost surface of the built-up layer, an interposer accommodated in the opening portion of the built-up layer and including a second substrate and a wiring layer formed on the second substrate, the wiring layer of the interposer including multiple conductive circuits for being connected to multiple semiconductor elements, and a filler filling the opening portion of the built-up layer such that the interposer is held in the opening portion of the built-up layer. The opening portion of the built-up layer has a tapered portion tapering toward the outermost surface of the built-up layer.

20 Claims, 11 Drawing Sheets

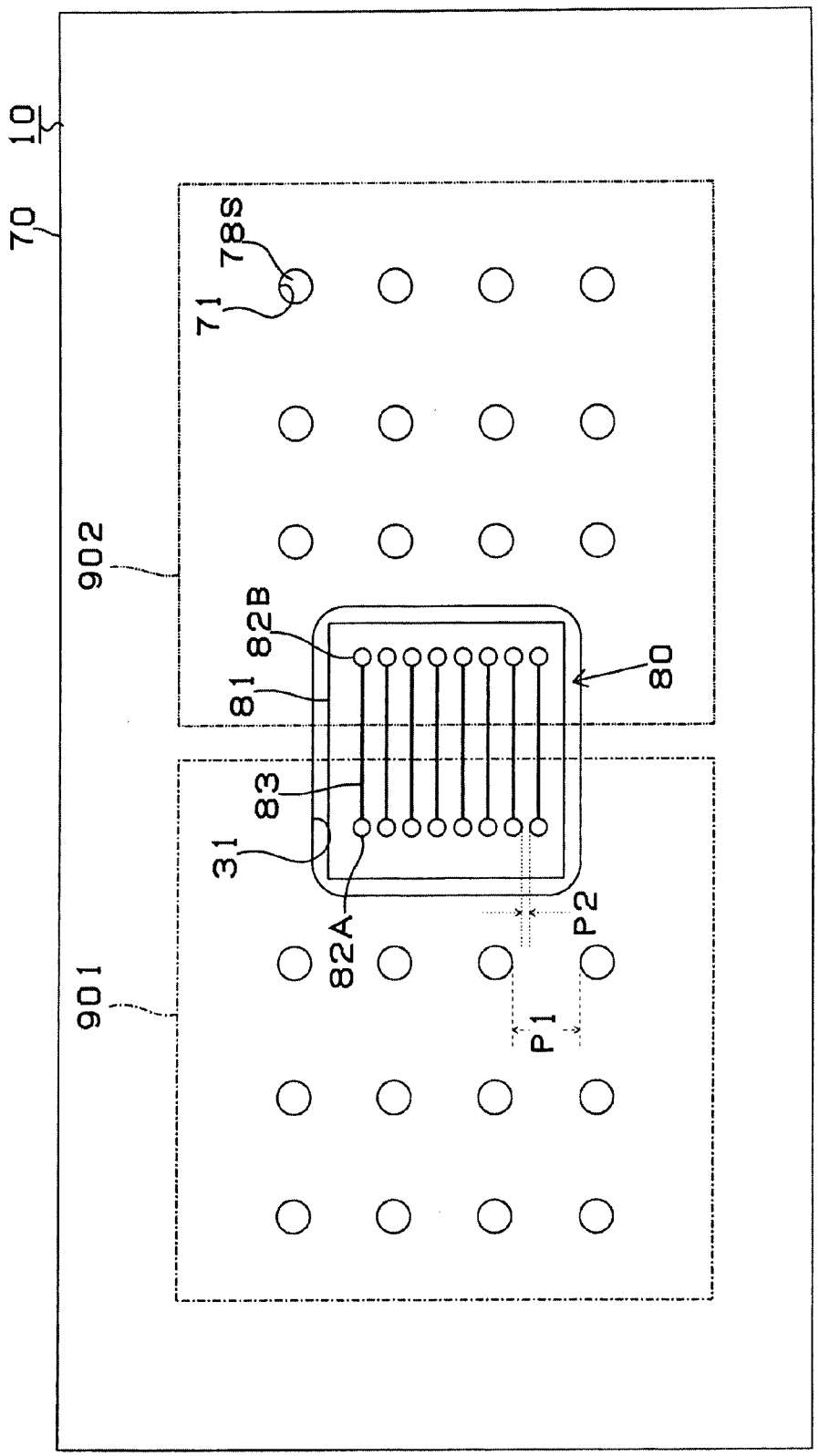

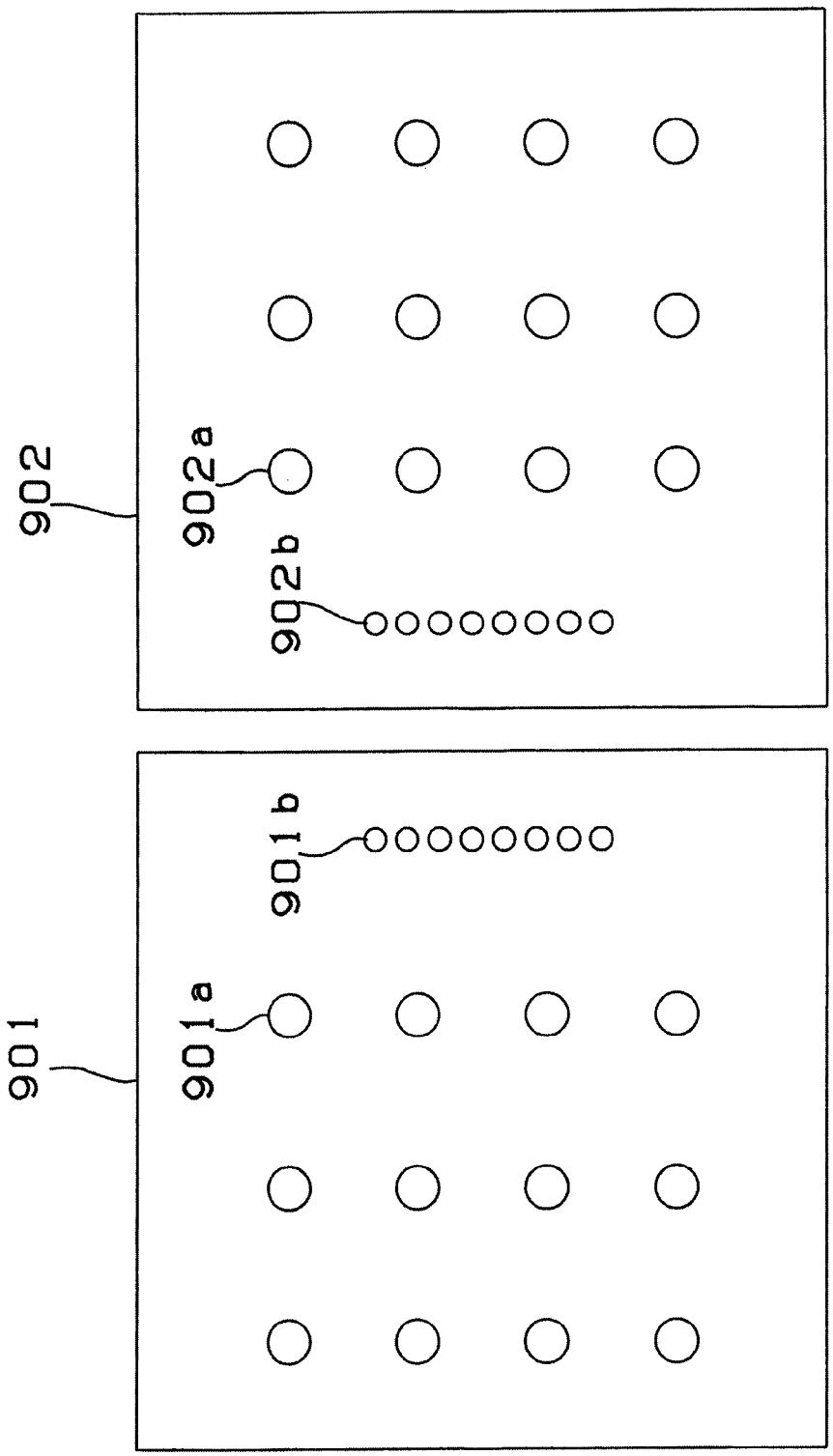

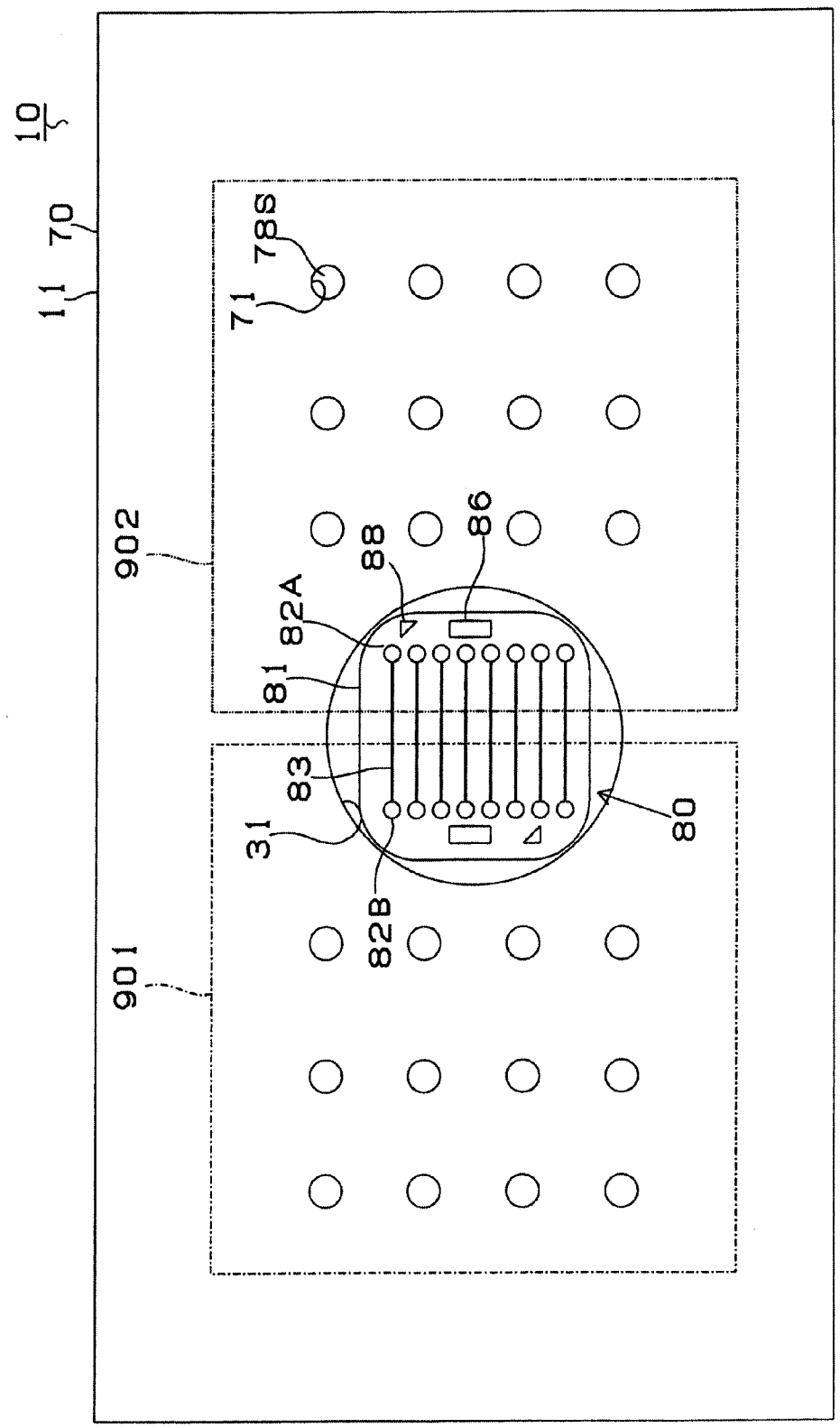

WIRING BOARD AND METHOD FOR MANUFACTURING THE SAME

CROSS-REFERENCE TO RELATED APPLICATIONS

The present application claims the benefits of priority to U.S. Application No. 61/319,024, filed Mar. 30, 2010. The contents of that application are incorporated herein by reference in their entirety.

BACKGROUND OF THE INVENTION

1. Field of the Invention

The present invention relates to a wiring board for mounting multiple IC chips and its manufacturing method.

2. Discussion of the Background

In Japanese Laid-Open Patent Publication 2000-353765, a multi-chip module is described. In such a module, a complex substrate is formed by laminating a flexible substrate on a rigid substrate, and a CPU and a memory are mounted on the complex substrate. The mounted CPU and memory are connected by wiring in inner layers of the complex substrate. The contents of this publication are incorporated herein by reference in their entirety.

SUMMARY OF THE INVENTION

According to one aspect of the present invention, a wiring board includes a first substrate having a penetrating hole penetrating through the first substrate, a built-up layer formed on one surface of the first substrate and including multiple interlayer resin insulation layers and multiple wiring layers, the built-up layer having an opening portion communicated with the penetrating hole of the first substrate and opened to the outermost surface of the built-up layer, an interposer accommodated in the opening portion of the built-up layer and including a second substrate and a wiring layer formed on the second substrate, the wiring layer of the interposer including multiple conductive circuits for being connected to multiple semiconductor elements, and a filler filling the opening portion of the built-up layer such that the interposer is held in the opening portion of the built-up layer. The opening portion of the built-up layer has a tapered portion tapering toward the outermost surface of the built-up layer.

According to another aspect of the present invention, a method for manufacturing a wiring board includes preparing a first substrate which has a penetrating hole penetrating through the first substrate, forming on one surface of the first substrate a built-up layer including multiple interlayer resin insulation layers and multiple conductive circuits, forming in the built-up layer an opening portion which is communicated with the penetrating hole of the first substrate and opened to the outermost surface of the built-up layer, accommodating in the opening portion of the built-up layer an interposer including a second substrate and a wiring layer formed on the second substrate, the wiring layer of the interposer including multiple second conductive circuits for being connected to multiple semiconductor elements, and filling a filler in the opening portion of the built-up layer such that the interposer is held in the opening portion of the built-up layer. The forming of the opening portion in the built-up layer includes forming a tapered portion in the opening portion such that the tapered portion of the opening portion is tapering toward the outermost surface of the built-up layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a plan view of the printed wiring board shown in FIG. 7;

FIG. 10 is a view showing bottom surfaces of a CPU chip and a memory chip to be mounted on the printed wiring board; and FIG. 11 is a plan view of a printed wiring board according to the second embodiment.

DETAILED DESCRIPTION OF THE EMBODIMENTS

Figure 1:
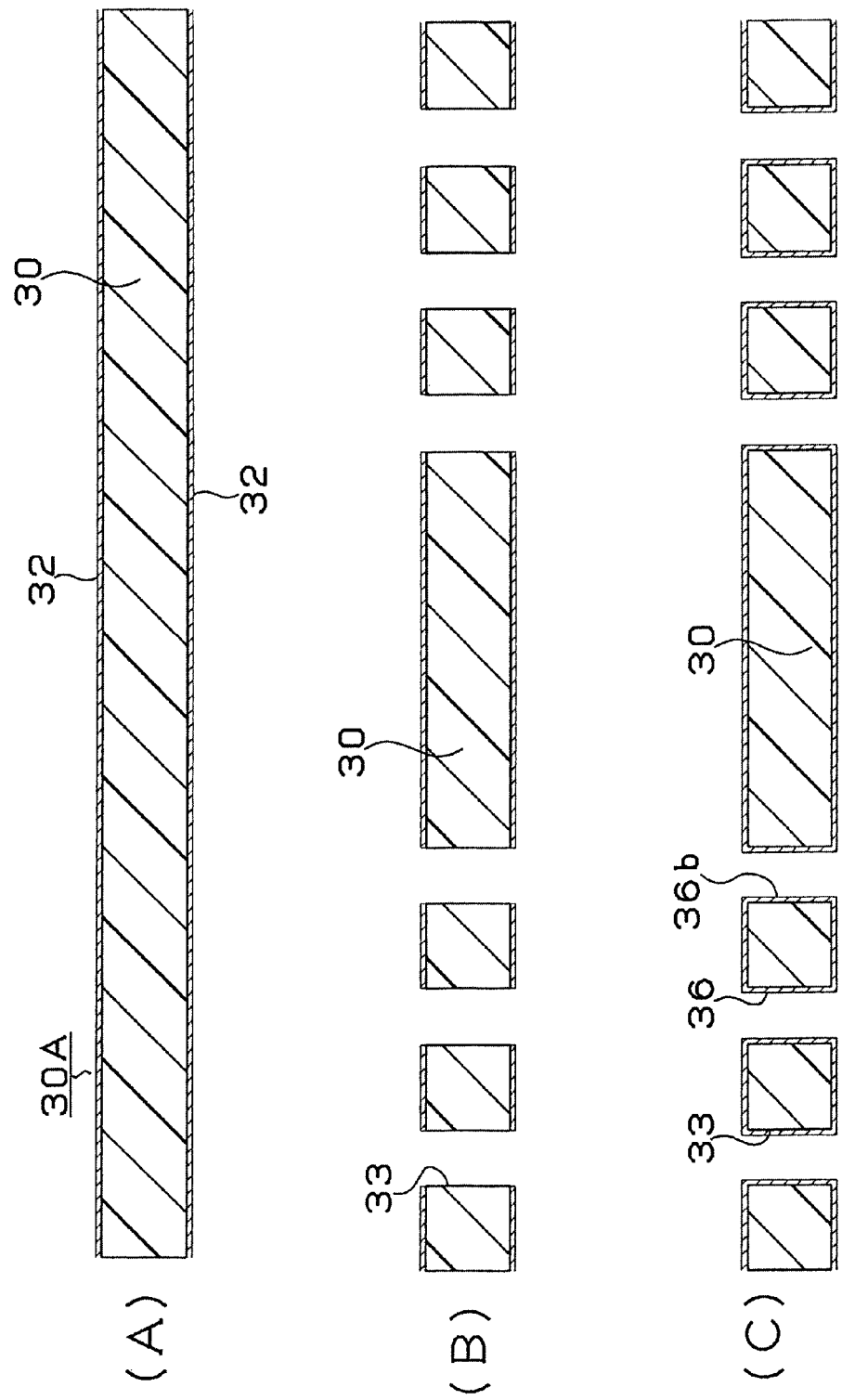
FIGS. 1(A) to (C) are views showing steps of a method for manufacturing a printed wiring board according to the first embodiment of the present invention.
Figure 2:
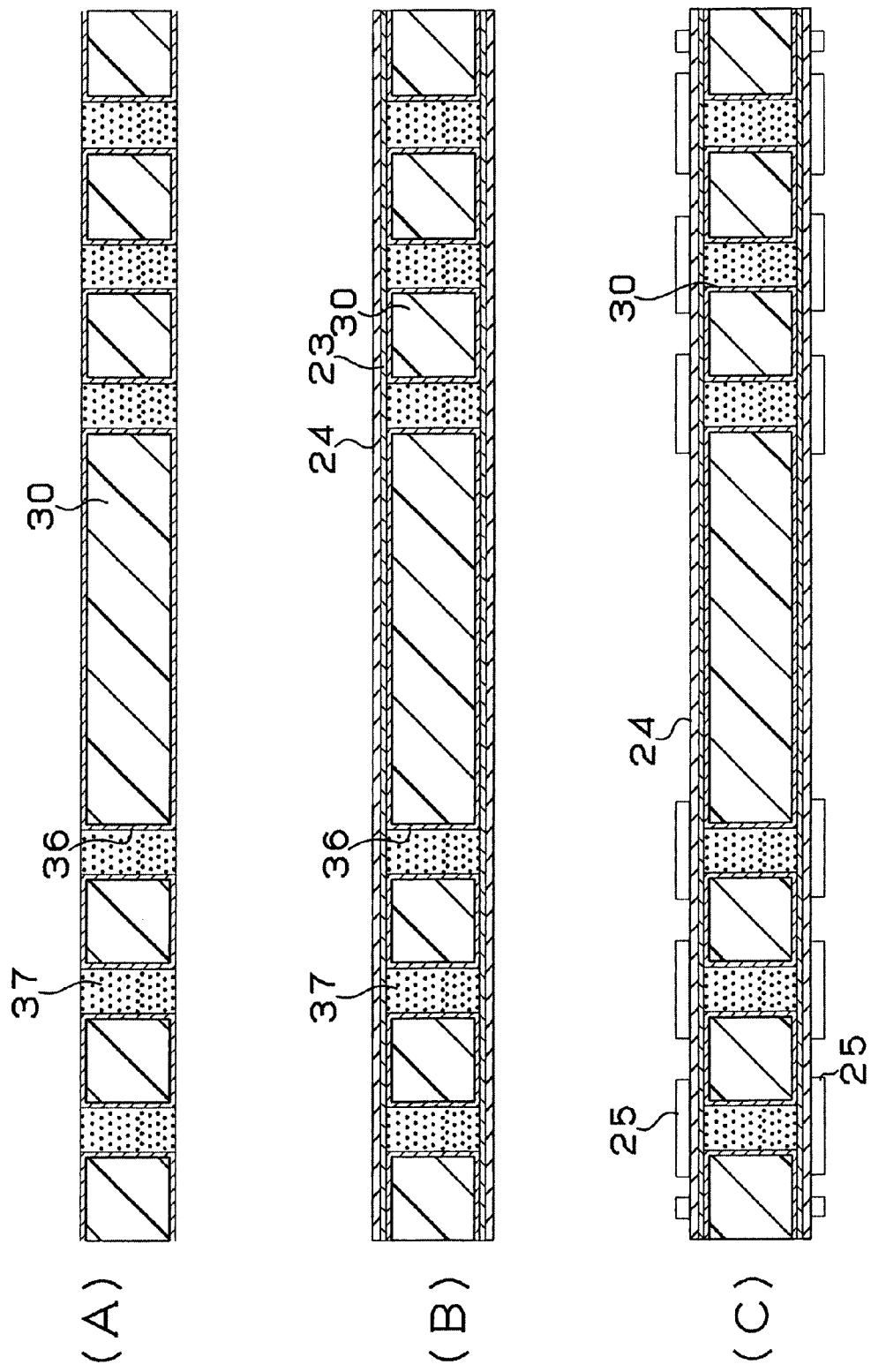
FIGS. 2(A) to (C) are views showing steps of a method for manufacturing a printed wiring board.
Figure 3:
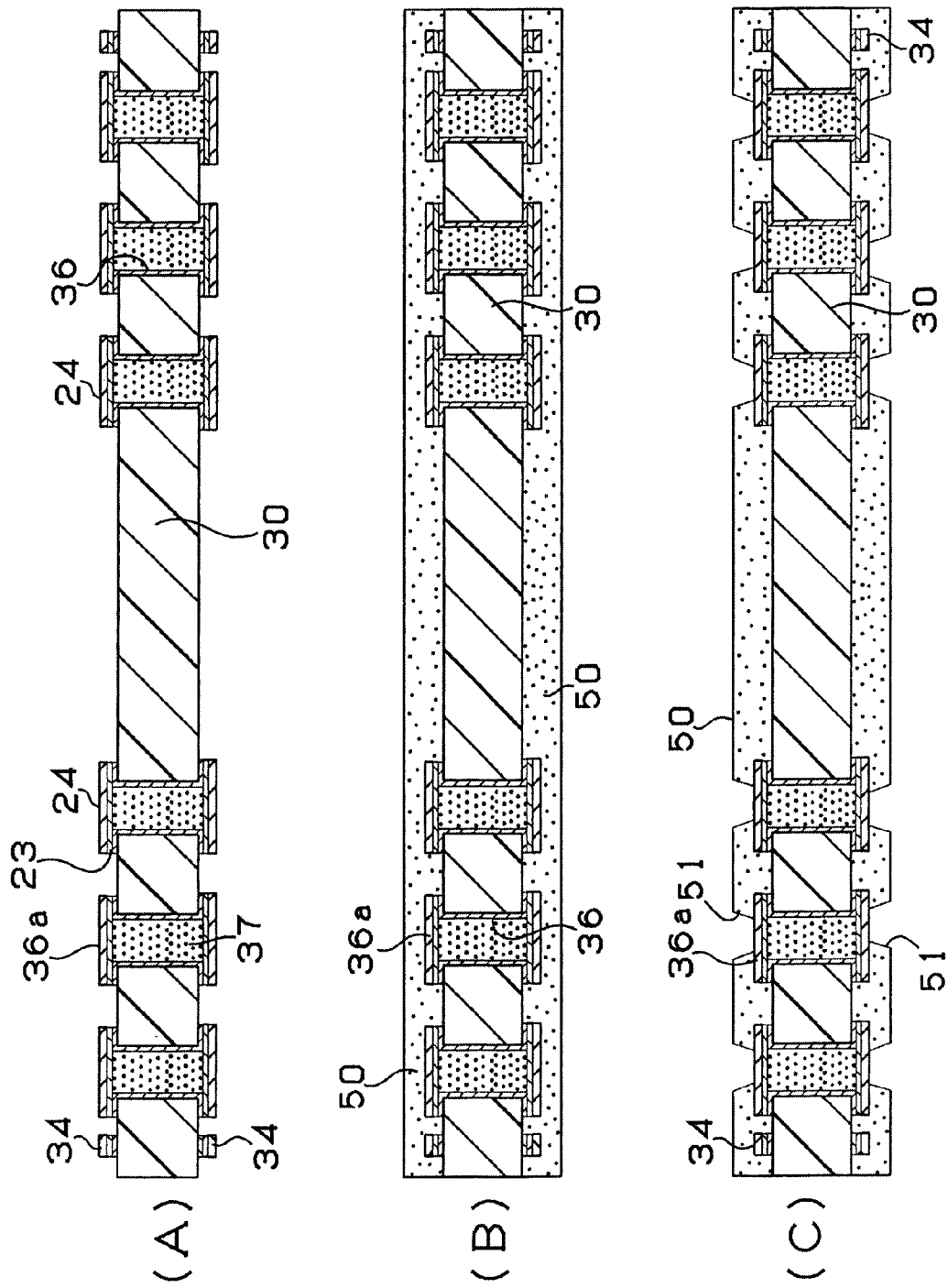
FIGS. 3(A) to (C) are views showing steps of a method for manufacturing a printed wiring board.
Figure 4:
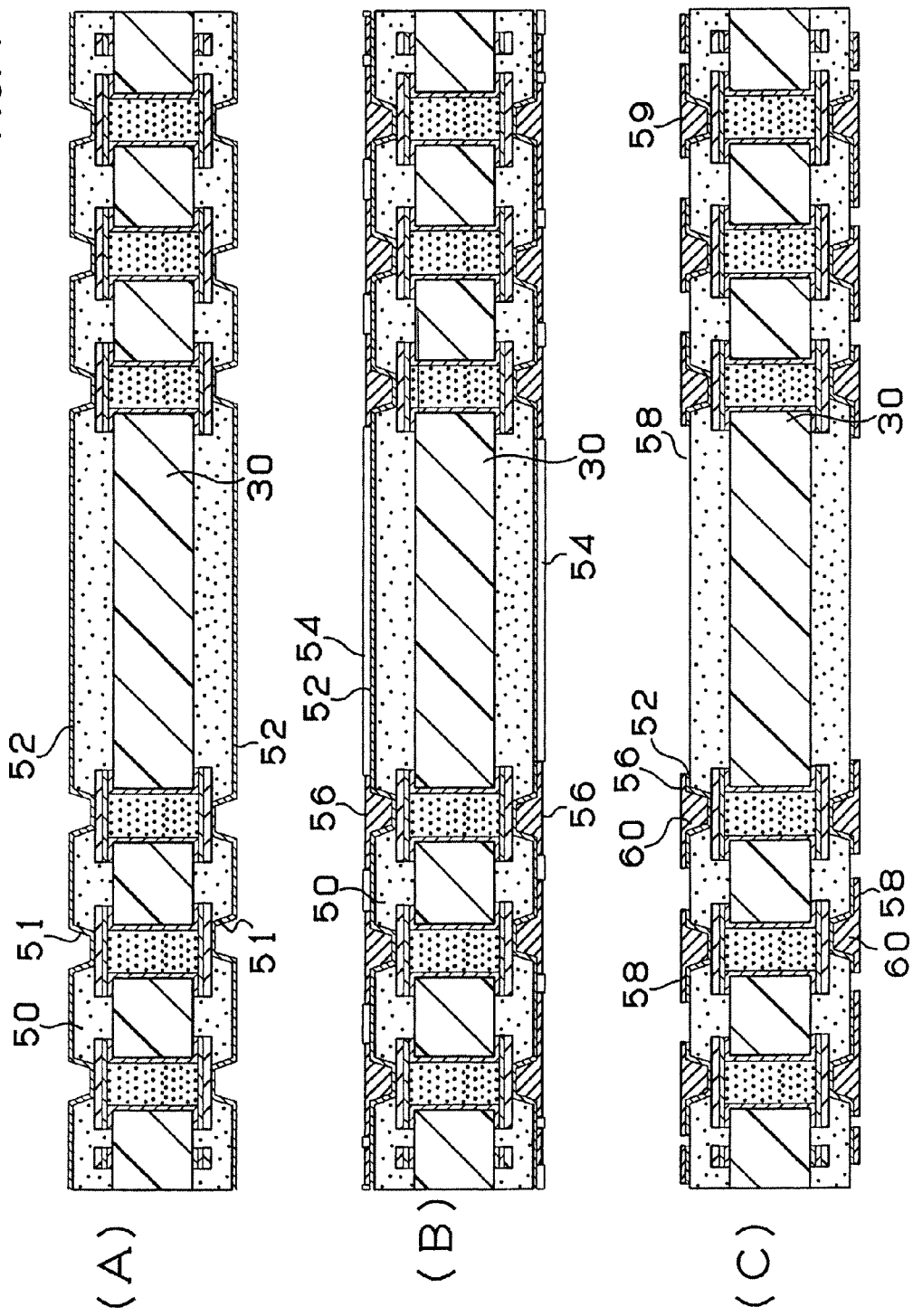
FIGS. 4(A) to (C) are views showing steps of a method for manufacturing a printed wiring board.
Figure 5:
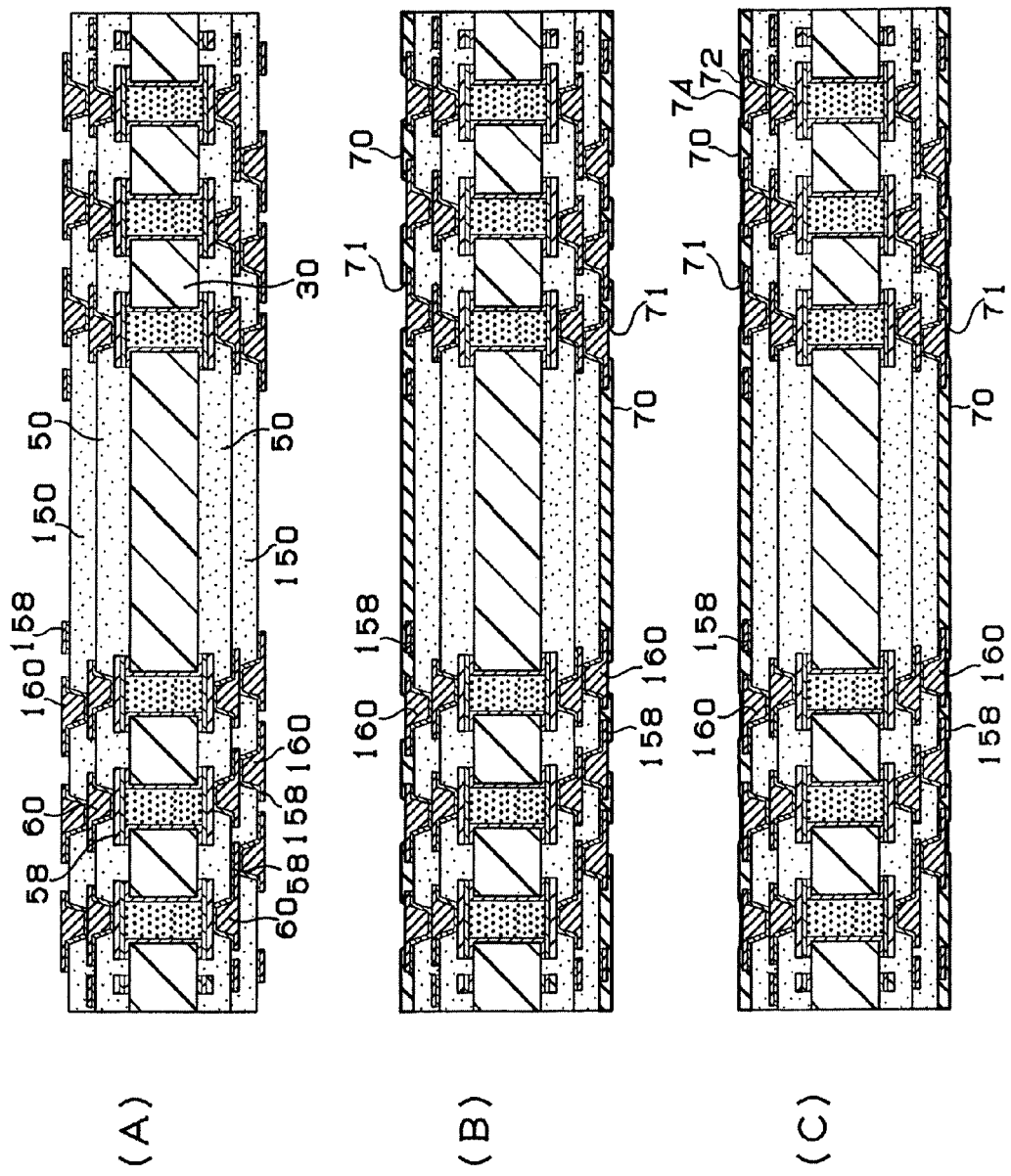
FIGS. 5(A) to (C) are views showing steps of a method for manufacturing a printed wiring board.
Figure 6:
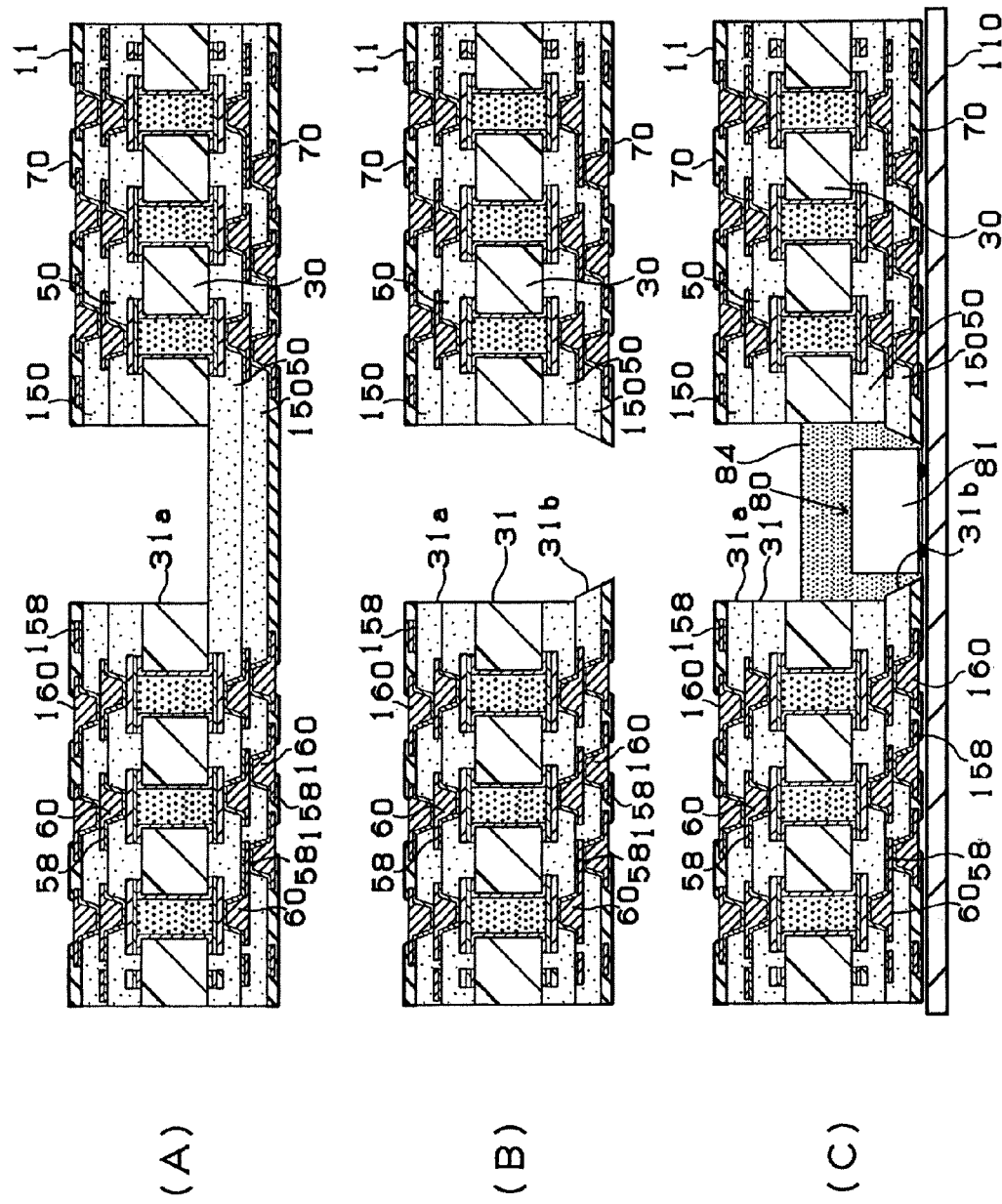
FIGS. 6(A) to (C) are views showing steps of a method for manufacturing a printed wiring board.

The embodiments will now be described with reference to the accompanying drawings, wherein like reference numerals designate corresponding or identical elements throughout the various drawings.

First Embodiment

Figure 7:
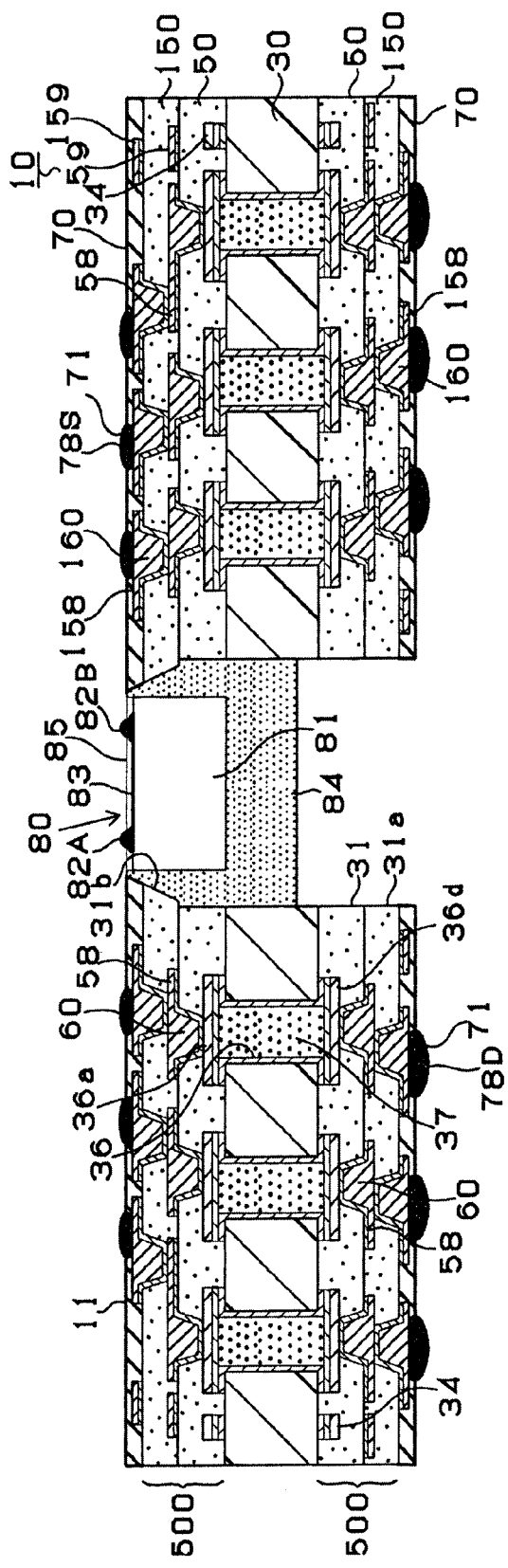
FIG. 7 is a cross-sectional view of a printed wiring board according to the first embodiment.
Figure 8:
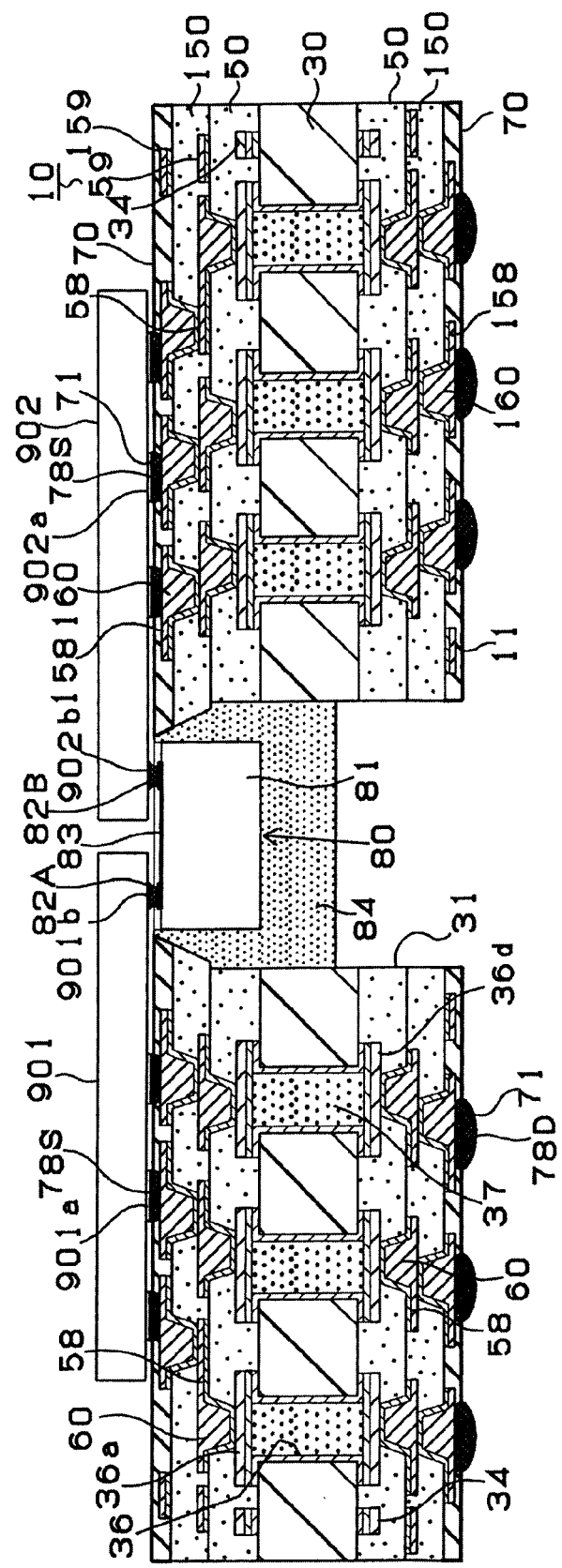
FIG. 8 is a cross-sectional view showing a printed wiring board on which a CPU chip and a memory chip are mounted.

With reference to FIGS. 7, 8, 9 and 10, the following describes the structure of printed wiring board 10 manufactured using a manufacturing method according to the first embodiment of the present invention. FIG. 7 shows a cross-sectional view of printed wiring board 10. FIG. 8 shows a semiconductor apparatus where CPU chip 901 and memory chip 902 are mounted on printed wiring board 10 shown in FIG. 7. FIG. 9 shows a plan view of printed wiring board 10 shown in FIG. 7. FIG. 10 is a view showing bottom surfaces of CPU chip 901 and memory chip 902 to be mounted.

As shown in FIG. 7, wiring board 10 accommodates interposer 80 in penetrating hole 31 formed substantially in the center of built-up multilayer wiring board 11. Built-up multilayer wiring board 11 is formed with core substrate 30 (first substrate) which contains conductive circuits 34 on its top and bottom surfaces, and built-up layers 500 formed on the core substrate. Conductive circuits 34 on core substrate 30 are connected by through-hole conductors 36. Built-up layers 500 have interlayer resin insulation layers 50 where via holes 60 and conductive circuits 58 are formed, and interlayer resin insulation layers 150 where via holes 160 and conductive circuits 158 are formed. Solder-resist layers 70 are formed as upper layers of via holes 160 and conductive circuits 158. In upper solder-resist layer 70, openings 71 are formed in which solder bumps (78S) are formed. In lower solder-resist layer 70, openings 71 are formed in which solder bumps (78D) are formed. Also, the conductive circuits are primarily used for power source and ground.

Interposer 80 has heat-resistant substrate 81 and a wiring layer formed on heat-resistant substrate 81. The wiring layer has signal lines 83 as second conductive circuits, insulative film 85 which is formed on signal lines 83 and has openings to partially expose signal lines 83, and bumps (82A, 82B) formed in the openings. Bumps (82A) are used to mount CPU chip 901, and bumps (82B) are used to mount memory chip 902. CPU chip 901 and memory chip 902 are electrically connected by signal lines 83. As shown in a plan view of FIG. 9, bumps (82A, 82B) in interposer 80 are positioned at pitch (P2) (approximately 40 μm). Also, solder bumps (78S) in the built-up multilayer wiring board are positioned at pitch (P1) (approximately 130 μm). In addition, the L/S of signal lines 83 in heat-resistant substrate 80 is set at 1/1 μm~3/3 μm. In the first embodiment, interposer 80 is made of silicon, and signal lines 83 and bumps (82A, 82B) are finely formed through a semiconductor manufacturing process. As for the material to form heat-resistant substrate 81, silicon, ceramic or glass with a thermal expansion coefficient of 2~10 ppm may be used.

As shown in FIG. 10, on the bottom surface of CPU chip 901, pads (901b) to be connected to bumps (82A) of interposer 80 are lined up along a single side, and pads (901a) to be connected to solder bumps (78S) of built-up multilayer wiring board 11 are further arranged in a matrix. In the same manner, on the bottom surface of memory chip 902, pads (902b) to be connected to bumps (82B) of interposer 80 are lined up along a single side, and pads (902a) to be connected to solder bumps (78S) of built-up multilayer wiring board 11 are further arranged in a matrix.

As shown in FIG. 8, in CPU chip 901, pads (901b) are connected to bumps (82A) of interposer 80 and pads (901a) are connected to solder bumps (78S) of built-up multilayer wiring board 11. In the same manner, in memory chip 902, pads (902b) are connected to bumps (82B) of interposer 80 and pads (902a) are connected to solder bumps (78S) of built-up multilayer wiring board 11.

In the printed wiring board according to the first embodiment, by accommodating interposer 80 with fine-pitch wiring in built-up multilayer wiring board 11, semiconductor elements with various pitches may be mounted on built-up multilayer wiring board 11. Thus, the size of the built-up multilayer wiring board is reduced.

In the first embodiment, signal pads (901b) of CPU 901 and signal pads (902b) of memory 902 are respectively arranged along a single side, and those elements are mounted on built-up multilayer wiring board 11 in such a way that those sides with arranged signal pads face each other. Then, signal pads (901b) of CPU 901 and signal pads (902b) of memory 902 are connected by signal lines 83 of interposer 80. By connecting the CPU and the memory with short signal lines 83 of interposer 80, high-speed, high-capacitance transmission is achieved between the CPU and the memory.

Next, a method for manufacturing printed wiring board 10 outlined above with reference to FIG. 7 is described with reference to FIGS. 1-8.

(1) The starting material was copper-clad laminate (30A) formed by laminating 5~250 μm-thick copper foil 32 on both surfaces of insulative substrate 30 made of 0.2~0.8 mm-thick glass-epoxy resin or BT (bismaleimide triazine) resin (FIG. 1(A)). First, by drilling the copper-clad laminate, through holes 33 are formed (FIG. 1(B)) and through-hole conductors 36 are formed by electroless plating and electrolytic plating (FIG. 1(C)). Then, after substrate 30 with through-hole conductors 36 is washed with water and dried, black-oxide treatment and reduction treatment are conducted to roughen the surfaces of side-wall conductive layers of through holes 36 and the substrate surfaces (not shown in the drawings).

(2) Next, filler 37 containing copper particles with an average particle diameter of 10 μm (such as nonconductive filling copper paste, brand name DD Paste, made by Tatsuta Electric Wire & Cable Co., Ltd.) is filled in through holes 36 by screen printing, dried and cured (FIG. 2(A)).

(3) A palladium catalyst (made by Atotech) is attached to the surfaces of substrate 30, and electroless copper plating is performed to form 0.6 μm-thick electroless copper-plated films 23. Then, electrolytic copper plating is performed to form 15 μm-thick electrolytic copper-plated films 24. Accordingly, portions to become conductive circuits 34 are thickened, and portions to become plated-cover layers (through-hole lands), which cover filler 37 filled in through holes 36, are formed (FIG. 2(B)).

(4) On both surfaces of substrate 30 where portions are formed to become conductive circuits and plated-cover layers, commercially available photosensitive dry film is laminated to form etching resists 25 (FIG. 2(C)).

(5) Then, plated films (23, 24) and copper foil 32 in portions where etching resists 25 are not formed are dissolved and removed using an etching solution, and etching resists 25 are further removed. In doing so, independent conductive circuits 34 and plated-cover layers (36a) covering filler 37 are formed (FIG. 3(A)). Surfaces of conductive circuits 34 and plated-cover layers covering filler 37 are roughened by etching (not shown in the drawings).

(6) On both surfaces of substrate 30, resin film for interlayer resin insulation layers (brand name: ABF-45SH, made by Ajinomoto) with a little larger size than substrate 30 is laminated, preliminarily pressed and cut to size. Then, the film is laminated using vacuum laminator equipment, and interlayer resin insulation layers 50 are formed (FIG. 3(B)).

(7) Next, via-hole openings 51 were formed in interlayer resin insulation layers 50 using a CO2 gas laser (FIG. 3(C)). The substrate with via-hole openings 51 was immersed for 10 minutes in an 80° C. solution containing 600 permanganic acid. Then, by removing the particles from the surfaces of interlayer resin insulation layers 50, the surfaces of interlayer resin insulation layers 50 including the inner walls of via-hole openings 51 were roughened (not shown in the drawings).

(8) Next, after the above treatment, the substrate was immersed in a neutralizer solution (made by Shipley Company) and then washed with water. Moreover, a palladium catalyst was applied to the substrate surfaces after the roughening treatment (roughened depth 3 μm) to attach catalyst nuclei on the surfaces of interlayer resin insulation layers and the inner-wall surfaces of via-hole openings.

(9) Next, the substrate with the catalyst was immersed in an electroless copper plating solution (Thru-Cup PEA) made by C. Uyemura & Co., Ltd. to form electroless copper-plated film with a thickness of 0.3~3.0 μm on the entire roughened surface. Accordingly, a substrate was obtained where electroless copper-plated film 52 was formed on the surfaces of interlayer resin insulation layers 50 including the inner walls of via-hole openings 51 (FIG. 4(A)).

(10) Commercially available photosensitive film was laminated on the substrate with electroless copper-plated films 52, a mask was placed, and the dry film was exposed to light and developed. Accordingly, 25 μm-thick plating resists 54 were formed. Then, the substrate was degreased, washed with water, and further cleansed with sulfuric acid. After that, electrolytic plating was performed to form 15 μm-thick electrolytic copper-plated films 56 in portions where plating resists 54 were not formed (FIG. 4(B)).

(11) Furthermore, after dissolving and removing plating resists 54, the electroless plated film under the plating resists were dissolved and removed by etching. Accordingly, independent conductive circuits 58 and via holes 60 were formed (FIG. 4(C)). By conducting the same treatment as above (5), surfaces of conductive circuits 58 and via holes 60 were roughened (not shown in the drawings).

(12) By repeating the above steps (6)~(11), further upper-layer interlayer insulation layers 150 containing conductive circuit 158 and via holes 160 were formed and a multilayer wiring board was obtained (FIG. 5(A)).

(13) Next, on both surfaces of the multilayer wiring board, a commercially available solder-resist composition was applied to be 20 μm thick and dried. Then, to cure the solder resist, a laser was irradiated on the solder-resist composition except for opening portions. After that, the uncured portions of the solder resist were removed using a chemical solution to form 15-25 μm-thick solder-resist pattern layers 70 having openings (71, 71) (FIG. 5(B)).

(14) Next, the substrate with solder-resist layers 70 was immersed in an electroless nickel plating solution and 5 μm-thick nickel-plated layers 72 were formed in opening portions (71, 71). Furthermore, the substrate was immersed in an electroless gold plating solution to form 0.03 μm-thick gold-plated layers 74 on nickel-plated layers 72, and solder pads were formed (FIG. 5(C)). Instead of nickel-gold layers, nickel-palladium-gold layers may also be formed.

(15) First opening section (31a) is formed to penetrate through core substrate 30 by drilling from a surface opposite the chip-mounting surface of built-up multilayer wiring board 11 (FIG. 6(A)). Here, by counter boring with a drill, first opening section (31a) is formed to be substantially rectangular when it is seen from the open side.

(16) A laser is irradiated from the side of first opening section (31a) in built-up multilayer wiring board 11 toward the chip-mounting surface, and second opening section (31b) is formed in interlayer resin insulation layers (50, 150) and solder-resist layer 70 on the chip-mounting side. Second opening section (31b) tapers toward the chip-mounting surface. Accordingly, penetrating hole 31 is formed with first opening section (31a) and second opening section (31b) (FIG. 6(B)).

(17) Built-up multilayer wiring board 11 is placed on support board 110, interposer 80 is accommodated in penetrating hole 31, and penetrating hole 31 is encapsulated with underfill resin 84 (FIG. 6(C)). Interposer 80 has heat-resistant substrate 81 and signal lines formed on heat-resistant substrate 81.

(18) Built-up multilayer wiring board 11 is removed from support board 110. By printing solder paste in openings 71 in built-up multilayer wiring board 11 and reflowing, solder bumps (78S, 78D) are formed. Printed wiring board 10 is completed (FIG. 7).

CPU 901 is mounted by aligning pads (901b) with bumps (82A) of interposer 80 and pads (901a) with solder bumps (78S) of built-up multilayer wiring board 11. Furthermore, memory chip 902 is mounted by aligning pads (902b) with bumps (82B) of interposer 80 and pads (902a) with solder bumps (78S) of built-up multilayer wiring board 11. Then, through a reflow process, CPU chip 901 and memory chip 902 are mounted on wiring board 10 (FIG. 8).

In the first embodiment, penetrating hole 31 to accommodate interposer 80 is made up of first opening section (31a) formed to penetrate through core substrate 30 by drilling from the side opposite the chip-mounting surface of built-up multilayer wiring board 11, and of second opening section (31b) formed by a laser in interlayer resin insulation layers (50, 150) on the side of the chip-mounting surface. Since a hole is formed by a laser on the chip-mounting side in interlayer resin insulation layers (50, 150) where conductive circuits (58, 158) are formed, fine-pitched conductive circuits (58, 158) are seldom damaged.

Also, since second opening section (31b) is formed by a laser in interlayer resin insulation layers (50, 150), a tapered portion is formed in second opening section (31b) tapering toward the chip-mounting surface. Therefore, when resin filler 84 is filled from the side opposite the chip-mounting surface, the flow of the filler is slowed by the tapered portion, and the resin filler does not overflow outside the penetrating hole, making filling easier. In addition, by forming a tapered portion, the contact area increases between the resin filler and the built-up layers (interlayer resin insulation layers), and stress generated due to differences in thermal expansion coefficients with semiconductor elements is mitigated. As a result, cracks in the built-up layers are suppressed from occurring.

Second Embodiment

A printed wiring board of the second embodiment is described with reference to FIG. 11, showing a plan view of a printed wiring board according to the second embodiment.

The structure of a printed wiring board according to the second embodiment is the same as that in the first embodiment described above with reference to FIGS. 7 and 9. However, in contrast to the first embodiment, in which penetrating hole 31 is formed to be a rectangular column so that its opening portion is rectangular, penetrating hole 31 is formed to be a cylinder so that its opening portion is circular in the second embodiment. Also, angular portions of interposer 80 are beveled off so that stress is not concentrated on the angular portions.

In addition, passive element 86 such as a resistor is arranged on a surface of interposer 80 in the second embodiment. Such passive element 86 may also be arranged inside built-up multilayer wiring board 11.

A printed wiring board according to an embodiment of the present invention has the following: a first substrate for mounting multiple chips, which is formed by building up layers on a core substrate with through holes by alternately laminating interlayer resin insulation layers and conductive circuits, and which has a penetrating hole; a second substrate accommodated in the penetrating hole; and filler filled in the penetrating hole. The technical features of such a printed wiring board are as follows: The second substrate contains pads to secure the multiple chips to be mounted on the first substrate and signal lines to link the pads and to electrically connect the multiple chip terminals.

For example, if conductive circuits connecting semiconductor elements mounted on a wiring board are formed on a second substrate, the wiring line/space of conductive circuits in built-up layers on a first substrate is eased. As a result, yield rates of wiring boards are improved. At that time, for example, signal pads of a CPU and a memory are arranged respectively along a single side, and the CPU and memory are mounted on the first substrate in such a way that those sides with arranged signal pads face each other. Then, the CPU's signal pads and the memory's signal pads are connected by signal lines in the second substrate. By connecting the CPU and the memory with short signal lines in the second substrate, high-speed, high-capacitance transmission is achieved between the CPU and the memory.

The second substrate is accommodated in an opening section formed in built-up layers on the first substrate. The opening section has a tapered portion which tapers toward the outermost surface of the built-up layers. Therefore, when filler is filled in the opening section after the second substrate is accommodated in the opening section, the flow of the filler is slowed by the tapered portion, and the filler does not overflow outside the opening section, making filling easier. In addition, by forming a tapered portion, the contact area increases between the filler and the built-up layers. Stress generated due to differences in thermal expansion coefficients between semiconductor elements is mitigated, and cracks in the built-up layers are suppressed from occurring.

In the above-described embodiments, examples are shown in which a CPU chip and a memory chip are mounted as semiconductor chips. However, a printed wiring board of the present invention may mount various types of chips. Furthermore, in the above-described embodiments, examples are shown in which a pair of chips are mounted. However, the number of semiconductor chips such as CPU chips, memory chips and the like is not limited specifically.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a first substrate having a first surface and a second surface on an opposite side of the first surface, the first substrate having a penetrating hole penetrating through the first substrate;
   a built-up layer formed on the first surface of the first substrate and comprising a plurality of interlayer resin insulation layers and a plurality of wiring layers, the built-up layer having an opening portion communicated with the penetrating hole of the first substrate and opened to an outermost surface of the built-up layer on an opposite side of the first substrate;
   an interposer accommodated in the opening portion of the built-up layer and comprising a second substrate and a wiring layer formed on the second substrate, the wiring layer of the interposer comprising a plurality of conductive circuits configured to be connected to a plurality of semiconductor elements;
   a filler filling the opening portion of the built-up layer such that the interposer is held in the opening portion of the built-up layer;
   a plurality of first mounting pads formed on the first substrate and positioned to mount the semiconductor elements; and
   a plurality of second mounting pads formed on the interposer and positioned to mount the semiconductor elements and electrically connect the semiconductor elements to the conductive circuits in the interposer,
   wherein the opening portion of the built-up layer has a tapered portion tapering toward the outermost surface of the built-up layer, the plurality of wiring layers in the built-up layer comprises a plurality of conductive circuits, the plurality of conductive circuits in the built-up layer is electrically connected to the semiconductor elements via the first mounting pads, and the second mounting pads have a pitch which is set smaller than a pitch of the first mounting pads.

2. The wiring board according to claim 1, wherein the tapered portion of the opening portion of the built-up layer is formed by removing a portion of the built-up layer by a laser.

3. The wiring board according to claim 1, wherein the plurality of conductive circuits in the interposer includes a plurality of signal lines connecting between the semiconductor elements.

4. The wiring board according to claim 1, wherein the second substrate of the interposer comprises a material having a thermal expansion coefficient of 2~10 ppm.

5. The wiring board according to claim 1, wherein the second substrate of the interposer comprises a material selected from the group consisting of silicon, a ceramic and a glass.

6. The printed wiring board according to claim 1, wherein and the conductive circuits in the interposer have L/S which is set smaller than L/S of the conductive circuits in the build-up layer.

7. The wiring board according to claim 1, wherein the plurality of conductive circuits in the built-up layer includes at least one of a power source line and a ground line.

8. The wiring board according to claim 1, wherein the built-up layer includes a passive element.

9. The wiring board according to claim 1, wherein the interlayer resin insulation layers and the conductive circuits in the built-up layer are alternately laminated.

10. The wiring board according to claim 1, further comprising a plurality of through-hole conductors formed through the first substrate.

11. The wiring board according to claim 1, further comprising:
    a plurality of through-hole conductors formed through the first substrate; and
    a second built-up layer formed on the second surface of the first substrate and comprising a plurality of interlayer resin insulation layers and a plurality of wiring layers, wherein the plurality of wiring layers in the built-up layer is electrically connected to the plurality of wiring layers in the second built-up layer via the through hole conductors.

12. The wiring board according to claim 1, further comprising:
    a plurality of through-hole conductors formed through the first substrate; and
    a second built-up layer formed on the second surface of the first substrate and comprising a plurality of interlayer resin insulation layers and a plurality of wiring layers, wherein the plurality of wiring layers in the built-up layer is electrically connected to the plurality of wiring layers in the second built-up layer via the through hole conductors, wherein the plurality of conductive circuits in the interposer includes a plurality of signal lines connecting between the semiconductor elements.

13. The wiring board according to claim 1, further comprising:
    a plurality of through-hole conductors formed through the first substrate; and
    a second built-up layer formed on the second surface of the first substrate and comprising a plurality of interlayer resin insulation layers and a plurality of wiring layers, wherein the plurality of wiring layers in the built-up layer is electrically connected to the plurality of wiring layers in the second built-up layer via the through hole conductors,
    wherein the second substrate of the interposer comprises a material having a thermal expansion coefficient of 2~10 ppm.

14. The wiring board according to claim 1, further comprising:
    a plurality of through-hole conductors formed through the first substrate; and
    a second built-up layer formed on the second surface of the first substrate and comprising a plurality of interlayer resin insulation layers and a plurality of wiring layers, wherein the plurality of wiring layers in the built-up layer is electrically connected to the plurality of wiring layers in the second built-up layer via the through hole conductors, wherein the second substrate of the interposer comprises a material selected from the group consisting of silicon, a ceramic and a glass.

15. The wiring board according to claim 1, wherein the plurality of conductive circuits in the built-up layer includes at least one of a power source line and a ground line, and the built-up layer includes a passive element.

16. A method for manufacturing a wiring board, comprising:
preparing a first substrate which has a first surface and a second surface and which has a penetrating hole penetrating through the first substrate;
forming on the first surface of the first substrate a built-up layer comprising a plurality of interlayer resin insulation layers and a plurality of conductive circuits;
forming in the built-up layer an opening portion which is communicated with the penetrating hole of the first substrate and opened to an outermost surface of the built-up layer on an opposite side of the first substrate;
accommodating in the opening portion of the built-up layer an interposer comprising a second substrate and a wiring layer formed on the second substrate, the wiring layer of the interposer comprising a plurality of conductive circuits configured to be connected to a plurality of semiconductor elements;
filling a filler in the opening portion of the built-up layer such that the interposer is held in the opening portion of the built-up layer,
forming a plurality of first mounting pads on the first substrate such that the first mounting pads are positioned to mount the semiconductor elements; and
forming a plurality of second mounting pads formed on the interposer such that the second mounting pads are positioned to mount the semiconductor elements and electrically connect the semiconductor elements to the conductive circuits in the interposer, wherein the forming of the opening portion in the built-up layer comprises forming a tapered portion in the opening portion such that the tapered portion of the opening portion is tapering toward the outermost surface of the built-up layer, the plurality of conductive circuits in the built-up layer is electrically connected to the semiconductor elements via the first mounting pads, and the second mounting pads are formed to have a pitch which is set smaller than a pitch of the first mounting pads.

17. The method for manufacturing a wiring board according to claim 16, wherein the forming of the tapered portion of the opening portion comprises removing a portion of the built-up layer by a laser.

18. The method for manufacturing a wiring board according to claim 16, wherein the forming of the built-up layer comprises alternately laminating the interlayer resin insulation layers and the conductive circuits in the built-up layer.

19. The method for manufacturing a wiring board according to claim 16, wherein the preparing of the first substrate comprises forming a plurality of through-holes through the first substrate and forming a plurality of through-hole conductors in the through-holes through the first substrate.

20. The method for manufacturing a wiring board according to claim 16, further comprising forming on the second surface of the first substrate a second built-up layer comprising a plurality of interlayer resin insulation layers and a plurality of wiring layers, wherein the preparing of the first substrate comprises forming a plurality of through-holes through the first substrate and forming a plurality of through-hole conductors in the through-holes through the first substrate, and the plurality of wiring layers in the built-up layer is electrically connected to the plurality of wiring layers in the second built-up layer via the through hole conductors.

* * * * *